United States Patent
Chuang

(10) Patent No.: US 7,922,804 B2
(45) Date of Patent: Apr. 12, 2011

(54) METHOD FOR PREPARING SOL-GEL SOLUTION FOR CIGS SOLAR CELL

(75) Inventor: Chuan-Lung Chuang, Taoyuan (TW)

(73) Assignee: Jenn Feng Industrial Co., Ltd., Taoyuan (TW)

( * ) Notice: Subject to any disclaimer, the term of this patent is extended or adjusted under 35 U.S.C. 154(b) by 240 days.

(21) Appl. No.: 12/410,461

(22) Filed: Mar. 25, 2009

(65) Prior Publication Data

US 2010/0242800 A1 Sep. 30, 2010

(51) Int. Cl.
*H01L 21/316* (2006.01)
(52) U.S. Cl. .................................. 106/287.18
(58) Field of Classification Search .............. 106/287.18
See application file for complete search history.

(56) References Cited

U.S. PATENT DOCUMENTS

| | | | |
|---|---|---|---|
| 6,023,020 A * | 2/2000 | Nishitani et al. | 136/255 |
| 7,306,823 B2 * | 12/2007 | Sager et al. | 427/217 |
| 7,553,540 B2 * | 6/2009 | Debergalis et al. | 428/335 |
| 7,604,843 B1 * | 10/2009 | Robinson et al. | 427/376.6 |
| 2005/0107478 A1 * | 5/2005 | Klimov et al. | 516/98 |
| 2006/0062902 A1 * | 3/2006 | Sager et al. | 427/74 |
| 2006/0207644 A1 * | 9/2006 | Robinson et al. | 136/243 |
| 2007/0092648 A1 * | 4/2007 | Duren et al. | 427/255.31 |
| 2008/0044570 A1 * | 2/2008 | Meyer et al. | 427/250 |
| 2008/0305045 A1 * | 12/2008 | Kuniyil et al. | 424/9.1 |
| 2009/0214763 A1 * | 8/2009 | Joo et al. | 427/76 |
| 2009/0260670 A1 * | 10/2009 | Li | 136/244 |
| 2009/0280598 A1 * | 11/2009 | Curtis et al. | 438/102 |

* cited by examiner

*Primary Examiner* — Jerry Lorengo
*Assistant Examiner* — Ross J Christie

(57) ABSTRACT

A method for preparing a sol-gel solution is provided. During a first stage mixture preparation process, a metal compound mixture is obtained by mixing compounds of Cu, In, Ga, and Se, a diluting dispersant is obtained by adding a diluent into a dispersant, a stabilizing adhesive is obtained by mixing a stabilizer, a leveling agent, and an adhesive together, an anti-freezing coagulant is obtained by mixing an anti-freezer with a retarding coagulant, and a metallic reducing agent is obtained by mixing a reducing agent, a metal complexing agent with a metal abstracting solvent. Then, the metal compound mixture, the diluting dispersant, the stabilizing adhesive, the anti-freezing coagulant, and the metallic reducing agent are mixed, heated and stirred, and then cooled down to obtain a sol-gel solution. The sol-gel solution can be provided for the ink coating technology for configuring the CIGS light absorbing layer of the CIGS solar cell.

11 Claims, 3 Drawing Sheets

METHOD FOR PREPARING SOL-GEL SOLUTION FOR CIGS SOLAR CELL

BACKGROUND OF THE INVENTION

1. Field of the Invention

The present invention relates generally to a method for fabricating a copper/indium/gallium/selenium (CIGS) solar cell, and more particularly, to a method for preparing a sol-gel solution for fabricating a CIGS solar cell.

2. The Prior Arts

Sources of fossil fuel had been mined and non-renewably consumed for many years, and are almost exhausted from the earth. It is a critical concern for the human being to find out reliable alternative energy sources for even the basic demand, survival. Biomass energy, geothermal energy, wind energy, and nuclear energy are all in consideration. However, when further in view of factors of reliability, security, and environment protection, none of them can be comparable with solar energy taken from the sunlight radiation. Almost everywhere of the earth can be illuminated by the sunlight, and the sunlight can be received and converted into electric energy without producing any contaminant. Therefore, solar energy is so far the cleanest alternative energy source.

A solar cell is a device for converting the sunlight energy into electric energy which can be more conveniently used. There are many kinds of solar cells developed and produced for satisfying different demands. Among all of these kinds, CIGS solar cell having the advantages of a higher absorbing efficiency and a higher photoelectric conversion efficiency is paid with more attention thereto.

In general, the CIGS solar cell is derived from a copper/indium/selenium (CIS) solar cell. The CIS solar cell includes $CuInSe_2$ as a main ingredient. $CuInSe_2$ is a semiconductor with a direct bandgap, especially having a very high absorbance. The forbidden bandwidth (Eg) of $CuInSe_2$ is 1 eV which is less than the range 1.4 to 1.5 eV which is believed as most suitable for a solar cell. As such, $Cu(InGa)Se_2$ having a higher forbidden bandwidth, Eg=1.6 eV, which is known as a CIGS polycrystalline material is prepared for improvement. The CIGS solar cell can achieve a high photoelectric conversion efficiency up to 19%, and a CIGS solar cell module can correspondingly achieve a relatively high photoelectric conversion efficiency up to 13%. Corresponding to different contents of the indium and gallium ingredients contained therein, the light absorbing range may extend from 1.02 eV to 1.68 eV, and thus achieving a high light absorbing efficiency up to $10^5$ $cm^{-1}$. As such, even a CIGS thin film having a thickness less than 1 μm can absorb more than 99% photons of the sunlight illuminated thereon.

FIG. 1 is a schematic diagram illustrating a conventional CIGS solar cell 1. Referring to FIG. 1, the CIGS solar cell 1 typically includes a glass substrate 10, a back electrode layer 20, a CIGS light absorbing layer 30, a buffer layer 40, and a transparent electrode layer 50. The back electrode layer 20 is provided for electric conduction, and is typically made of molybdenum. The CIGS light absorbing layer 30 is a p-type semiconductor layer, adapted for absorbing light. The buffer layer 40 is an n-type semiconductor layer, and typically made of cadmium sulfide (CdS). The transparent electrode layer 50 is typically made of aluminum zinc oxide (AZO), indium zinc oxide (IZO), or indium tin oxide (ITO), which has a high light transparency and a high electric conductivity. As shown in FIG. 1, a sunlight L is downwardly incident to the CIGS solar cell 1. The sunlight L enters the transparent electrode layer 50, and then passes through the buffer layer 40, and reaches the CIGS light absorbing layer 30. The CIGS light absorbing layer 30 absorbs the sunlight L and produces electron hole pairs having electric potential energy. The transparent electrode layer 50 and the back electrode layer 20 then output the electric potential for power supplying.

FIG. 2 is a flow chart illustrating a process for fabricating the conventional CIGS solar cell. Referring to FIG. 2, first at step S10, a magnetron sputtering process is conducted in which a molybdenum target is bombarded for depositing a back electrode layer having a thickness about 1 mm onto a glass substrate. Then, at step S20, a CIGS light absorbing layer having a thickness about 2 mm is adaptively deposited onto the back electrode layer. Then, at step S30, a chemical bath deposition (CBD) process is conducted for configuring a buffer layer, e.g., CdS. And finally, at step S40, a sputtering process or a chemical vapor deposition (CVD) process is conducted for providing a transparent electrode, thus configuring the CIGS solar cell as shown in FIG. 1.

Typically, evaporation deposition, sputtering deposition, electrochemical deposition, and ink coating are often selected for configuring the CIGS light absorbing layer at step S20 during the above-illustrated process for fabricating the conventional CIGS solar cell. However, each of the evaporation deposition, the sputtering deposition, and the electrochemical deposition involves a vacuum processing which requires expensive equipment investment. As to the ink coating technology, it is a non-vacuum technology developed by International Solar Electric Technology Inc. (ISET). According to the ink coating technology, metal or oxide nanoparticles are prepared by nanotechnology, and are then mixed with a suitable solvent thus forming a gelatinous mixture. Then, the gelatinous mixture is provided onto the molybdenum layer to configure the CIGS light absorbing layer by for example an ink process. In such a way, the ink coating technology can save much fabrication cost.

Unfortunately, the metal or oxide nanoparticles required for the ink coating technology are not easy to prepare, and the solvent for forming the gelatinous mixture is inconvenient to compound. Therefore, the ink coating technology lacks reliable source of raw material.

As such, a method for preparing a gelatinous mixture of metal particles and a solvent is desired for uniformly mixing the metal particles and the solvent with an adaptive mixing process thus providing a solution of the conventional technology.

SUMMARY OF THE INVENTION

A primary objective of the present invention is to provide a method for preparing a sol-gel solution. According to the method, during a first stage mixture preparation process, a metal compound mixture is obtained by mixing compounds of Cu, In, Ga, and Se, a diluting dispersant is obtained by adding a diluent into a dispersant, a stabilizing adhesive is obtained by mixing a stabilizer, a leveling agent, and an adhesive together, an anti-freezing coagulant is obtained by mixing an anti-freezer with a retarding coagulant, and a metallic reducing agent is obtained by mixing a reducing agent, a metal complexing agent with a metal abstracting solvent. Then, the metal compound mixture, the diluting dispersant, the stabilizing adhesive, the anti-freezing coagulant, and the metallic reducing agent are mixed, heated and stirred, and then cooled down while being stirred, thus a sol-gel solution is obtained. The sol-gel solution can be provided for the ink coating technology for configuring the CIGS light absorbing layer onto the metal thin film layer of the glass substrate of the CIGS solar cell.

In such a way, according to the method provided by the present invention, a sol-gel solution containing a desired ratio of metal ingredients can be prepared for the ink coating technology, for configuring the desired CIGS light absorbing layer, thus solving the problem of the conventional technology.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
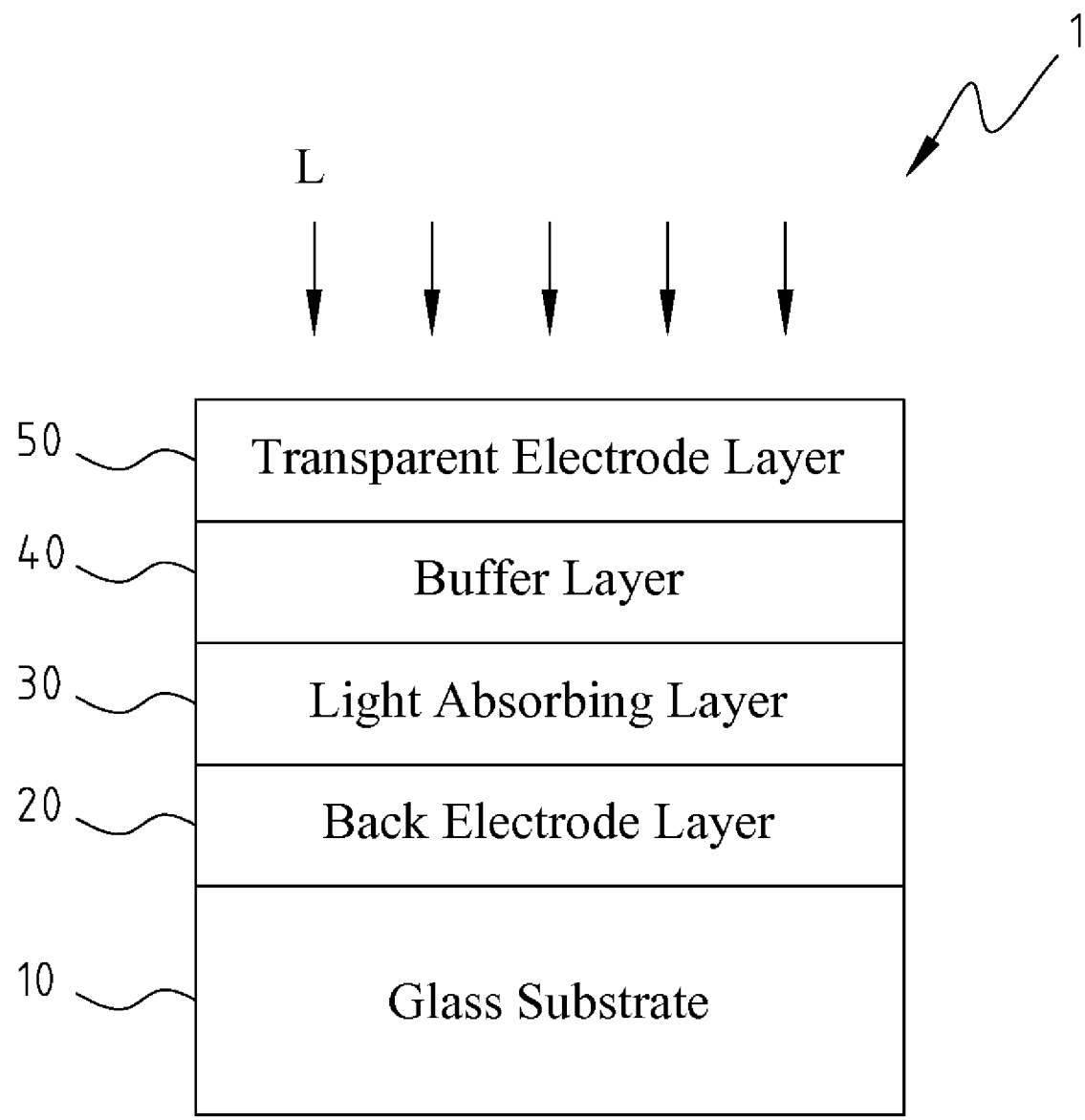
FIG. 1 is a schematic diagram illustrating a conventional CIGS solar cell.
Figure 2:
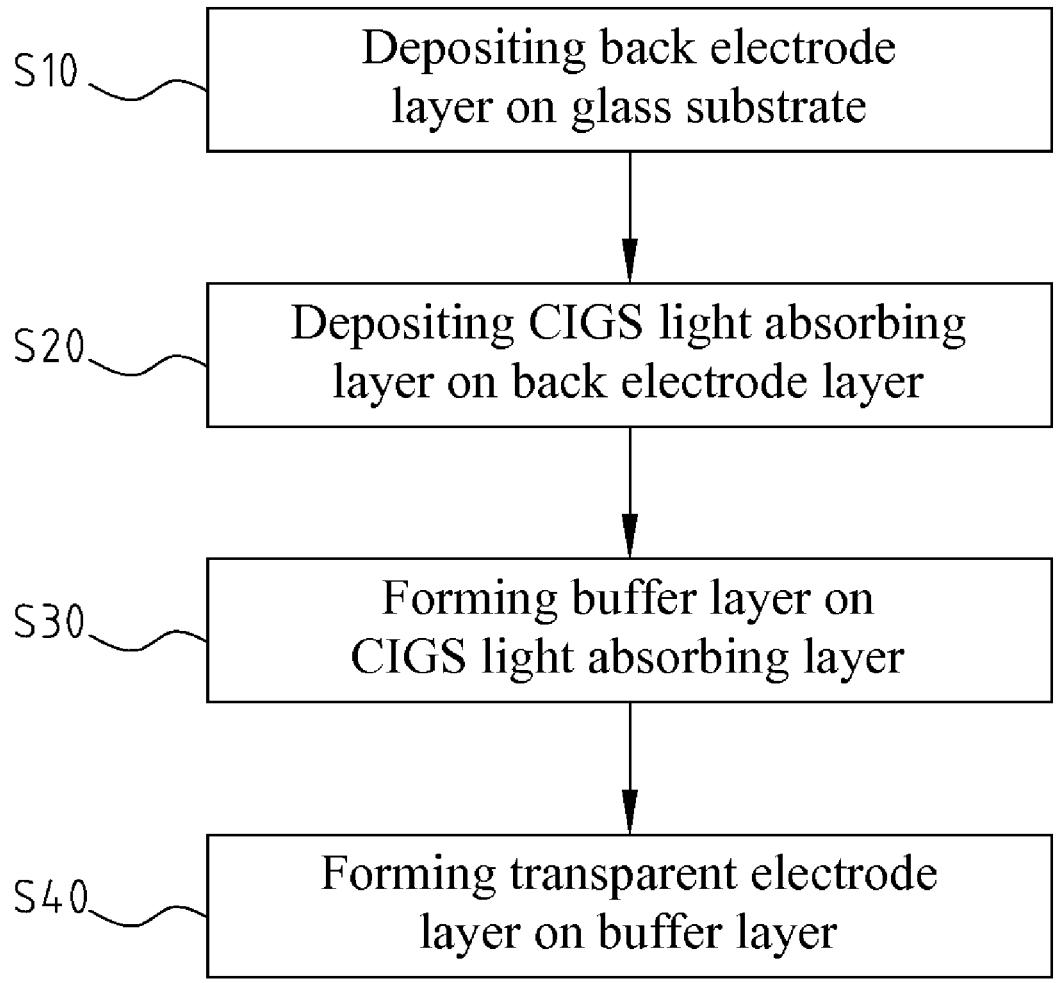
FIG. 2 is a flow chart illustrating a process for fabricating the conventional CIGS solar cell.
Figure 3:
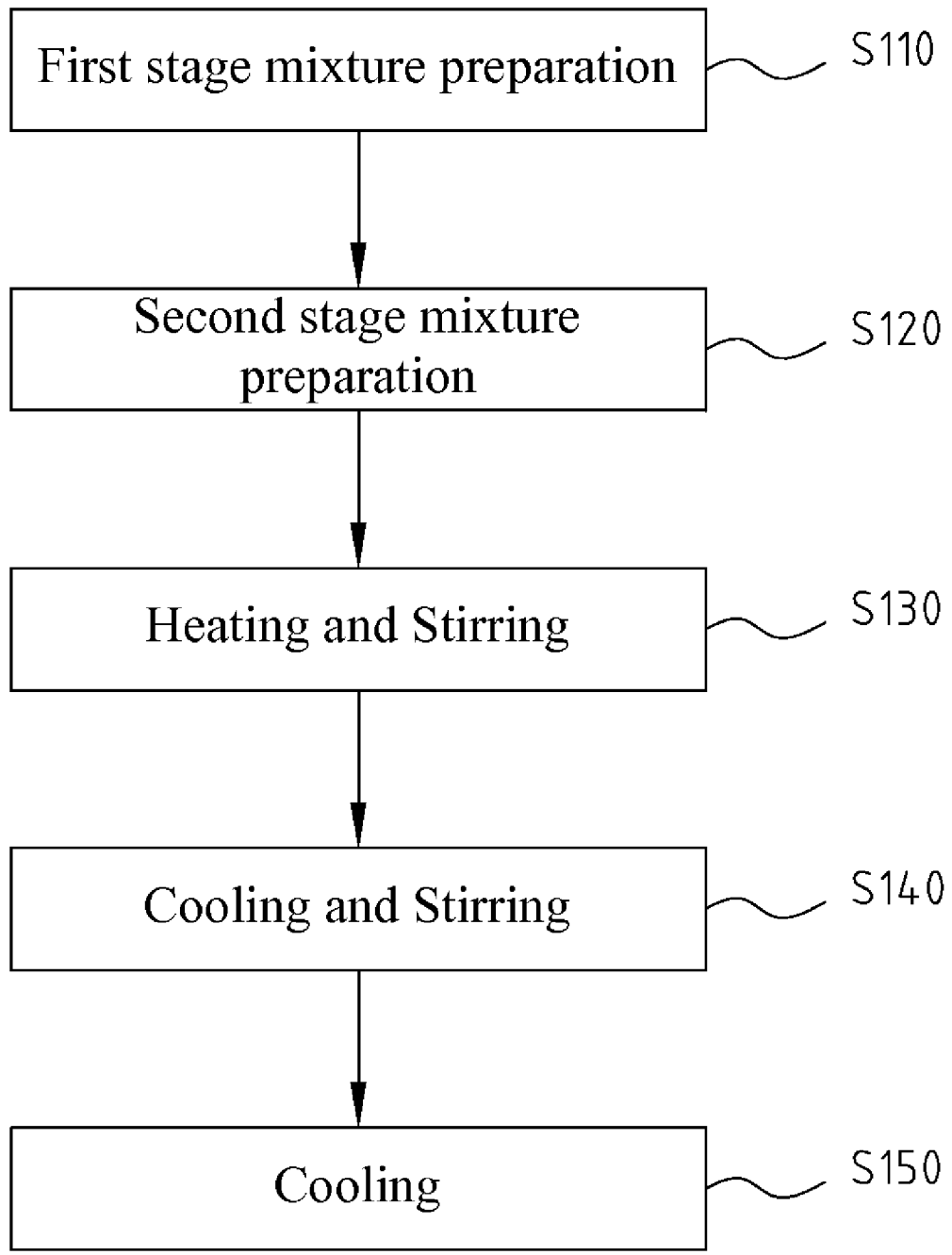
FIG. 3 is a flow chart illustrating a method for preparing a sol-gel solution for fabricating a CIGS solar cell according to an embodiment of the present invention.

FIG. 3 is a flow chart illustrating a method for preparing a sol-gel solution for fabricating a CIGS solar cell according to an embodiment of the present invention. Referring to FIG. 3, the flow starts from step S110. At step S110, a first stage mixture preparation process is executed. During the first stage mixture preparation process, a metal compound mixture, a diluting dispersant, a stabilizing adhesive, an anti-freezing coagulant, and a metallic reducing agent are prepared respectively. The metal compound mixture is obtained by mixing compounds of Cu, In, Ga, and Se. The diluting dispersant is obtained by adding a diluent into a dispersant. The stabilizing adhesive is obtained by mixing a stabilizer, a leveling agent, and an adhesive together. The anti-freezing coagulant is obtained by mixing an anti-freezer with a retarding coagulant. The metallic reducing agent is obtained by mixing a reducing agent, a metal complexing agent with a metal abstracting solvent. Then, the flow enters step S120. At step S120, a second stage mixture preparation process is executed. During the second stage mixture preparation process, the metal compound mixture of Cu, In, Ga, and Se, the diluting dispersant, the stabilizing adhesive, the anti-freezing coagulant, and the metallic reducing agent are mixed together to obtain a second stage mixture, and then the flow enters step S130. At step S130, the second stage mixture is heated to reach a first predetermined temperature, and is then maintained at the first predetermined temperature and stirred for a first predetermined time. Preferably, the first predetermined temperature ranges from 100° C. to 135° C., and the first predetermined time ranges from 30 minutes to 2 hours. Then the flow enters step S140, at which the second stage mixture is cooled down from the first predetermined temperature to a second predetermined temperature, and then the second stage mixture is maintained at the second predetermined temperature and stirred for a second predetermined time. Preferably, the second predetermined temperature ranges from 70° C. to 90° C., and the second predetermined time ranges from 30 minutes to 2 hours. Then the flow enters step S150, at which the second stage mixture is cooled down to obtain the desired sol-gel solution.

According to an aspect of the embodiment, the metal compound mixture of step S110 includes at least one of the group consisting of $Cu_2Se$, $In_2Se_3$, $Ga_2Se_3$, $Cu_2S$, $In_2S_3$, $Ga_2S_3$, $CuInGaSe_2$, $CuInGaS_2$, $CuInS_2$, $CuInSe_2$, $CuGaS_2$, $CuGaSe_2$, $CuAlS_2$, $CuInAlSe_2$, $Na_2S$, cupric acetate, indium acetate, gallium acetate, cupric sulfate, indium sulfate, gallium sulfate, cupric chloride, indium chloride, gallium chloride, and selenious acid.

Further, preferably, the diluent of the diluting dispersant includes at least one of deionized water and 2-methoxyethanol, and the dispersant of the diluting dispersant includes at least one of polyacrylic acid and polyvinyl acetate. The adhesive of the stabilizing adhesive includes at least one of polyvinylformamide and polyacrylamide. The leveling agent of the stabilizing adhesive includes at least one of polyacrylate and acetic acid. The stabilizer of the stabilizing adhesive includes at least one of diethanolamine, ethanolamine, glycol, and propylene glycol. The anti-freezer of the anti-freezing coagulant includes at least one of ethanol, and isopropanol. The retarding coagulant of the anti-freezing coagulant includes at least one of glacial acetic acid and oxalic acid. The reducing agent of the metallic reducing agent includes at least one of ammonia water, sodium hydroxide, potassium hydroxide, and sodium citrate. The metal complexing agent of the metallic reducing agent includes acetyl acetone, and the metal abstracting solvent includes oxalic acid.

The sol-gel solution prepared by the method of the present invention is adapted for applications of ink coating, spray coating, immersion coating, or spin coating method, so as to forming the CIGS light absorbing layer of the CIGS solar cell. As such, the method of the present invention can be employed for improving the efficiency of fabricating the CIGS solar cells, and thus saving production cost.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method for preparing a sol-gel solution for fabricating a copper/indium/gallium/selenium (CIGS) solar cell, the sol-gel solution being adapted for forming a GIGS light absorbing layer of the GIGS solar cell in accordance with a thin film deposition method, the method comprising:

Step A: executing a first stage mixture preparation process for forming a metal compound mixture comprising Cu, In, Ga and Se, a diluting dispersant, a stabilizing adhesive, an anti-freezing coagulant, and a metallic reducing agent, respectively, and then entering step B;

Step B: executing a second stage mixture preparation process for mixing the metal compound mixture of Cu, In, Ga, and Se, the diluting dispersant, the stabilizing adhesive, the anti-freezing coagulant, and the metallic reducing agent up to obtain a second stage mixture, and then entering step C;

Step C: heating the second stage mixture to a first predetermined temperature, and then executing a first stirring operation for a first predetermined time, and then entering step D;

Step D: cooling the second stage mixture down to a second predetermined temperature, and then executing a second stirring operation for a second predetermined time, and then entering step E; and Step E: cooling the second stage mixture to obtain the sol-gel solution.

2. The method according to claim 1, wherein the thin film deposition method is ink coating method, spray coating method, immersion coating method, or spin coating method.

3. The method according to claim 1, wherein the metal compound mixture comprises at least one of the group consisting of $Cu_2Se$, $In_2Se_3$, $Ga_2Se_3$, $Cu_2S$, $In_2S_3$, $Ga_2S_3$, $CuInGaSe_2$, $CuInGaS_2$, $CuInS_2$, $CuInSe_2$, $CuGaS_2$, $CuGaSe_2$, $CuAlS_2$, $CuInAlSe_2$, $Na_2S$, cupric acetate, indium acetate, gallium acetate, cupric sulfate, indium sulfate, gallium sulfate, cupric chloride, indium chloride, gallium chloride, and selenious acid.

4. The method according to claim 1, wherein the diluting dispersant comprises a diluent and a dispersant, wherein the diluent comprises at least one of deionized water and 2-methoxyethanol, and the dispersant comprises at least one of polyacrylic acid and polyvinyl acetate.

5. The method according to claim 1, wherein the stabilizing adhesive comprises an adhesive, a leveling agent, and a stabilizer, wherein the adhesive comprises at least one of polyvinylformamide and polyacrylamide, the leveling agent comprises at least one of polyacrylate and acetic acid, and the stabilizer comprises at least one of diethanolamine, ethanolamine, glycol, and propylene glycol.

6. The method according to claim 1, wherein the anti-freezing coagulant comprises an anti-freezer and a retarding coagulant, wherein the anti-freezer comprises at least one of ethanol, and isopropanol, and the retarding coagulant comprises at least one of glacial acetic acid and oxalic acid.

7. The method according to claim 1, wherein the metallic reducing agent comprises a reducing agent, a metal complexing agent, and a metal abstracting solvent, wherein the reducing agent comprises at least one of ammonia water, sodium hydroxide, potassium hydroxide, and sodium citrate, the metal complexing agent comprises acetyl acetone, and the metal abstracting solvent comprises oxalic acid.

8. The method according to claim 1, wherein the first predetermined temperature of step C ranges from 100° C. to 135° C.

9. The method according to claim 1, wherein the first predetermined time of step C ranges from 30 minutes to 2 hours.

10. The method according to claim 1, wherein the second predetermined temperature of step D ranges from 70° C. to 90° C.

11. The method according to claim 1, wherein the second predetermined time of step D ranges from 30 minutes to 2 hours.

* * * * *